(12) United States Patent
Dennard et al.

(10) Patent No.: US 6,370,072 B1
(45) Date of Patent: Apr. 9, 2002

(54) LOW VOLTAGE SINGLE-INPUT DRAM CURRENT-SENSING AMPLIFIER

(75) Inventors: Robert H. Dennard, New Rochelle; Arvind Kumar, New York, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/726,377

(22) Filed: Nov. 30, 2000

(51) Int. Cl.[7] ................................................ G11C 7/02
(52) U.S. Cl. ........................................ 365/210; 365/203
(58) Field of Search ................................. 365/210, 203

(56) References Cited

U.S. PATENT DOCUMENTS

| | | | |
|---|---|---|---|
| 5,467,312 A | * 11/1995 | Albon et al. | 365/203 |
| 5,592,428 A | * 1/1997 | Harrand et al. | 365/210 |
| 5,710,739 A | * 1/1998 | Calligaro et al. | 365/210 |
| 5,917,754 A | * 6/1999 | Pathak et al. | 365/210 |
| 6,108,259 A | * 8/2000 | Choi et al. | 365/210 |
| 6,118,702 A | * 9/2000 | Shieh et al. | 365/210 |

OTHER PUBLICATIONS

"A High–Speed Sensing Scheme for 1T Dynamic RAM's Utilizing the Clamped Bit–Line Sense Amplifier", by Travis N. Blalock, et al., IEEE Journal of Solid State Circuits, vol. 27, No. 4, Apr. 1992, pp. 618–624.

* cited by examiner

Primary Examiner—Trong Phan
(74) Attorney, Agent, or Firm—Scully, Scott, Murphy & Presser; Marian Underweiser, Esq.

(57) ABSTRACT

In a DRAM memory circuit, a current sensing amplifier is provided that exploits the low impedance of a reference transistor biased in the sub-threshold regime to enable transfer of a small voltage swing on the bitline to result in a large voltage signal on a low capacitance sense node. Compared to conventional voltage sensing, reduced bitline-bitline coupling noise results because of the small bitline swing, potentially allowing more cells to be served by a sense amplifier because of weak dependence of sense amplifier on bit-line capacitance. Compared to previous current-sensing schemes, this invention allows no idling current. The current-sensing amplifier additionally may be used in conjunction with a hierarchical bitline scheme to further increase the number of cells served by each sense amplifier.

21 Claims, 5 Drawing Sheets

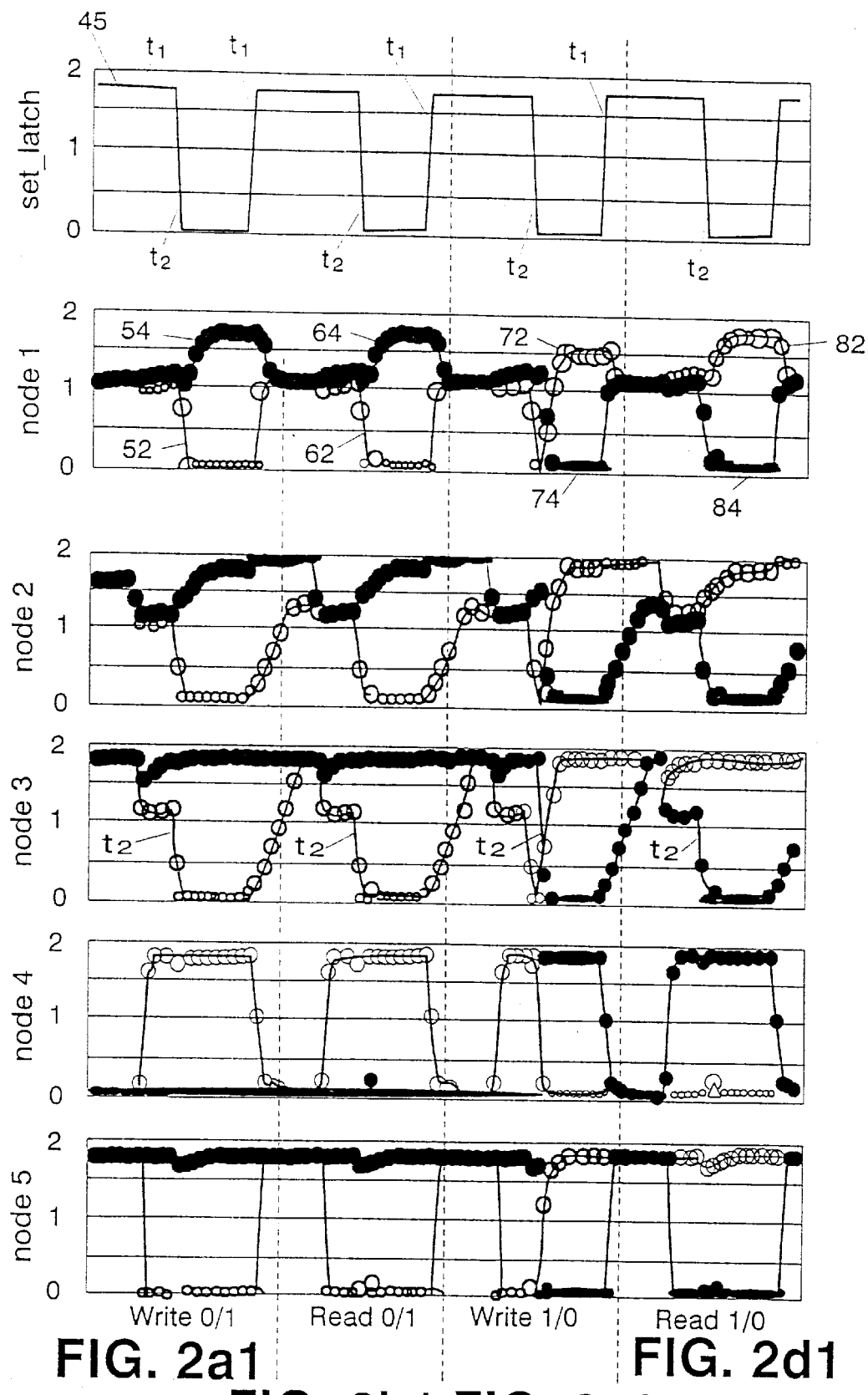
FIG. 2a1  FIG. 2b1  FIG. 2c1  FIG. 2d1

LOW VOLTAGE SINGLE-INPUT DRAM CURRENT-SENSING AMPLIFIER

BACKGROUND OF THE INVENTION

1. Field of the Invention

This invention relates generally to Dynamic Random Access Memory (DRAM) integrated circuits, and more specifically, to a novel current-sensing amplifier for rapidly sensing memory cell state for low voltage, high density DRAM circuits.

2. Discussion of the Prior Art

As supply voltages are scaled down in DRAM technology, the voltage drive in a conventional cross-coupled latch required for a rapid sensing of memory cell state is correspondingly reduced. Current sensing is used commonly in SRAMs but proposals for its use in DRAMs have been limited and typically focused on high speed rather than low power (see, e.g., T. Blalock and R. Jaeger entitled "A High-Speed Sensing Scheme for 1T Dynamic RAM's Utilizing the Clamped Bit-Line Sense Amplifier," IEEE Journal of Solid State Circuits 27, 618 (1992)). The use of a reference transistor in the sub-threshold regime for DRAM sensing has been proposed by R. Dennard and R. Knepper in commonly-owned, co-pending U.S. patent application Ser. No. 09/777,004; with again an emphasis on high-speed rather than low voltage and low power. In the device described in aforementioned U.S. patent application Ser. No. 09/777,004, a small current is continuously drawn from the sense amplifier, thus resulting in increased power consumption.

The signal required in conventional voltage sensing is also a strong function of the capacitance of the bit line. Hence, the need to maintain an adequate noise margin severely restricts the number of cells that can be served by a single sense amplifier, thus limiting the array efficiency.

Another limitation to the array efficiency arises because a conventional cross-coupled latch sense amplifier operates using two complementary inputs. To eliminate common-mode noise, the two inputs are usually "folded" to lie on the same side of the sense amplifier. In such a folded bit line architecture, a passing word line is required, and a memory cell can be placed only at one-half of the crosspoints between word lines and bit lines. In the vertically folded (twisted) scheme, such as described in the reference by H. Hoenigschmid, et al., Symp. on VLSI Circuits, Dig. Tech. Papers, p. 125, June 1999, the two complementary inputs are constructed using different wiring levels twisted with each other so that the passing word line can be eliminated and a memory cell can be placed at every crosspoint.

However, the vertically folded bit line scheme still suffers from the drive and capacitance limitations discussed above, in addition to the additional complexity imposed by the additional wiring level.

In view of the aforementioned drawbacks, it would be highly desirable to provide a single input DRAM current sensing amplifier that includes a reference transistor biased in the sub-threshold regime to advantageously exploit its low impedance characteristic.

It would be further desirable to provide DRAM current sensing amplifier of low input impedance that includes a single bit-line input permitting a low voltage swing and enabling reduction of inter bit line coupling noise (low noise).

Moreover, it would be highly desirable to provide a single input DRAM current sensing amplifier with reduced sensitivity to bit line capacitance so more memory cells could be served with a single sense amplifier, thus improving array efficiency.

It would additionally be highly desirable to provide a single input DRAM current sensing amplifier for a DRAM memory cell that does not depend directly on supply voltage, thus maintaining speed as supply voltages are scaled down.

It would further be highly desirable to provide a single input DRAM current sensing amplifier for a DRAM memory cell that obviates the need for d.c. idling (quiescent) current thereby reducing power consumption requirements.

Additionally, it would further be highly desirable to provide a single input DRAM current sensing amplifier that allows placement of memory cells at every crosspoint of word and bit lines without complexity of additional wiring level (high array efficiency).

SUMMARY OF THE INVENTION

It is an object of the present invention to provide in a DRAM memory circuit, a current sensing amplifier of low input impedance that includes a single bit-line input permitting a low voltage swing and enabling reduction of inter bit line coupling noise (low noise).

It is a further object of the present invention to provide in a DRAM memory circuit, a current sensing amplifier with reduced sensitivity to bit line capacitance so more memory cells could be served with a single sense amplifier, thus improving array efficiency.

It is another object of the present invention to provide in a DRAM memory circuit, a single-input current sensing amplifier that advantageously exploits the low input impedance characteristic of a reference transistor biased in the sub-threshold regime.

It is still another object of the present invention to provide a single input DRAM current sensing amplifier for a DRAM memory cell that does not depend directly on supply voltage, thus maintaining speed as supply voltages are scaled down.

It is yet another object of the present invention to provide a single input DRAM current sensing amplifier for a DRAM memory cell that obviates the need for d.c. idling current thereby reducing power consumption requirements.

Yet, still another object of the present invention to provide a single input DRAM current sensing amplifier that allows placement of memory cells at every crosspoint without complexity of additional wiring level to thereby further increase array efficiency.

According to the principles of the invention there is provided a current sensing system and method for a memory circuit comprising an array of memory cells, each memory cell for storing a charge that is accessible by bit-line and a word-line, with a bitline having one or more cells connected thereto, the current sensing system comprising: a sense amplifier device for sensing a bit-line voltage, the sense amplifier device including a reference transistor having first, second and gate terminals, a first terminal defining an amplifier sense node, a second terminal for receiving a bit line input, and a gate terminal for receiving a reference voltage; a mechanism for preventing quiescent current flow through the reference transistor prior to a sensing operation, and enabling current flow through the reference transistor from a first voltage source during a sensing operation; a second voltage source for applying precharge voltage to the bit-line such that the reference transistor may be biased to a sub-threshold regime during a sense operation, wherein, upon accessing a memory cell during the sense operation, the reference transistor is biased to the sub-threshold regime for enabling a large voltage swing at the amplifier sense node depending upon a state of said memory cell, while exhibiting low bit-line voltage swing.

Advantageously, such a current-sensing amplifier according to the invention enables an increased number of cells to be served due to its weak dependence on bit-line capacitance. Additionally, the single-input nature of the amplifier eliminates the need for either a passing word line or an additional wiring level. If an additional bit-line wiring level is available, the current-sensing amplifier may be used in conjunction with a hierarchical bit-line scheme to further increase the number of cells served by each sense amplifier (very high array efficiency).

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENTS

Figure 1:
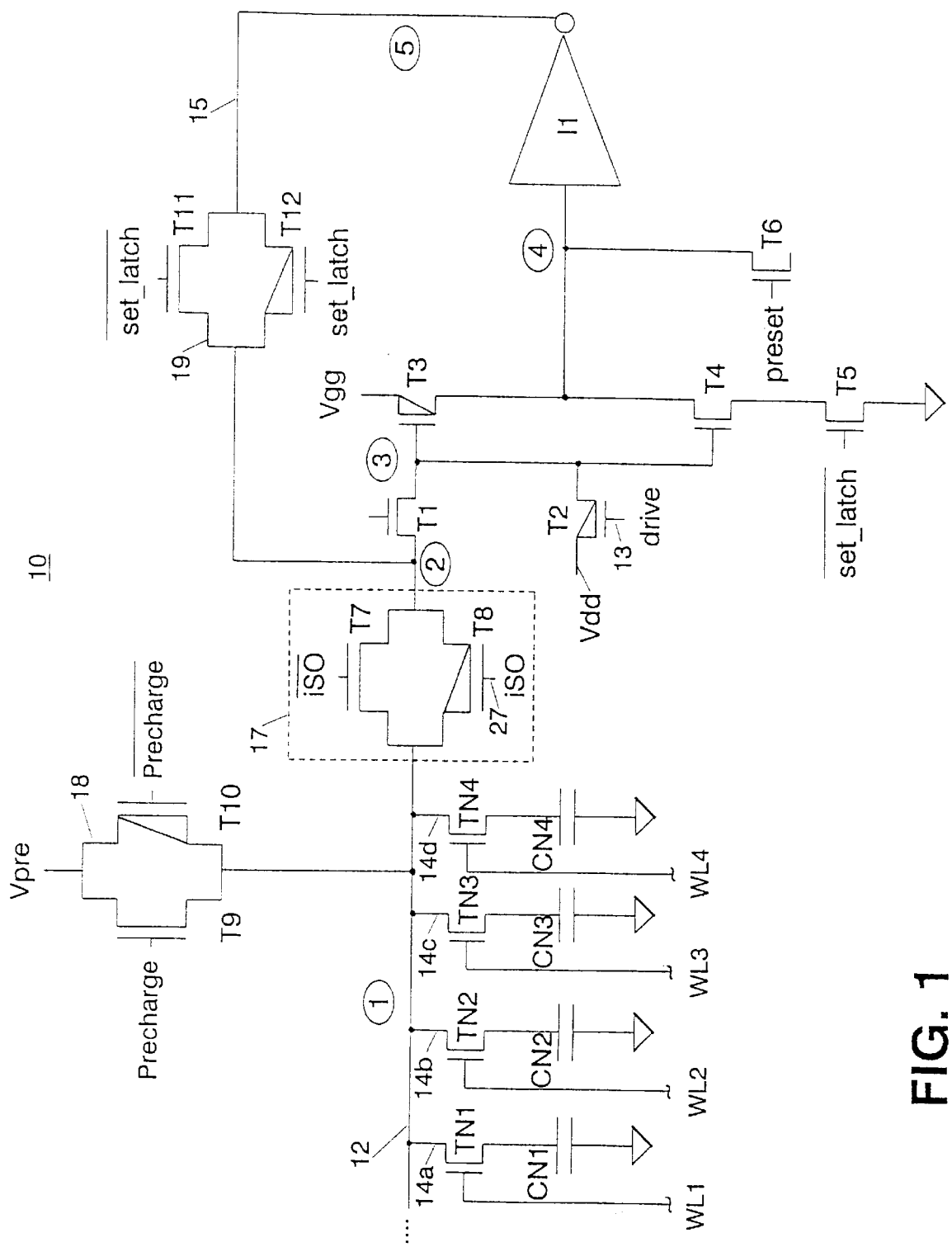
FIG. 1 is a detailed schematic of the current-sensing amplifier 10 according to the preferred embodiment of the invention.

FIG. 1 is a detailed schematic of the current-sensing amplifier 10 according to the preferred embodiment of the invention. As known to skilled artisans, this embodiment may be part of an entire DRAM macro consisting of memory array, sense amplifiers, and other peripheral circuitry. The invention is well-suited to low voltage, high density DRAM where bitline coupling noise issues become critical.

As shown in FIG. 1, the current-sensing amplifier 10 comprises a configuration of CMOS transistors including n-channel FET devices T1 and T4–T6 and p-channel FET devices T2–T3 at the input to a standard CMOS inverter I1. Additionally shown in FIG. 1 are four DRAM cells 14a, . . . 14 d on a memory array bitline 12 with each cell comprising a respective access transistor TN1, . . . ,TN4 each controlled by a respective wordline WL, . . . , WL4, and respective DRAM cell capacitors labeled CN1, . . . , CN4 which have values typically of about $C_N$=30 fF (femtoFarads). It is understood that the bitline 12 extends further with additional cells (not shown) attached having cell transistors, cell capacitors, and wordlines similar to those indicated in the FIG. 1. In one embodiment, the input of the sense amplifier, as indicated at node 2, is connected to the bitline 12 node 1 through the intermediary of a CMOS transmission gate 17 which comprises parallel connected transistors T7–T8. This transmission gate 17 may be additionally used to enable multiplexing of two or more bitlines into the same sense amplifier when desired. As will be described in greater detail herein, in a second embodiment, the bitline may be directly connected to the input of the sense amplifier, without the provision of a transmission gate.

Additionally connected to the bitline 12 at node 1 is a voltage precharging circuit for precharging the bitline 12 to a fixed voltage before the sensing operation begins. The voltage precharging circuit is connected to the bitline 12 line through the intermediary of a CMOS transmission gate 18 comprising parallel connected transistors T9–T10. As shown in FIG. 1, a feedback loop 15 is further provided for latching and writing data back to the bitline 12 from output of the CMOS inverter I1. The feedback loop is connected to node 2 of the bitline via the intermediary of a transmission gate 19 comprising transistors T11–T12.

The operation of the current-sensing amplifier 10 in accordance with a first embodiment, is now described. Initially, all wordlines WL1–WL4 are at ground potential (0.0 V), so that all DRAM cells 14a, . . . 14d are isolated from the bitline 12. Using the transmission gate 18, the bitline 12 is precharged to a voltage value $V_{pre}$ enabled by the bitline capacitance (e.g., $C_{b1}$=100 fF) inherent in the memory cell bit-line structure. Given a $V_{ref}$ voltage at the gate input of transistor T1, the precharge voltage value at the bitline 12 is chosen such that $V_{ref}-V_{pre}\cong V_t$, the threshold voltage of transistor T1. While the bitline 12 is being precharged to a voltage $V_{pre}$, node 3, the current sensing node, is set to a voltage value $V_{dd}$ through a current-supplying transistor T2, whose gate is fixed at a drive voltage 13 and whose source is fixed at $V_{dd}$. It is understood that a small capacitance ranging typically between 10.0 fF–20.0 fF is present at the current sense node. The precharge voltage $V_{pre}$ is chosen such that the current through T1 will be less than or equal to the current flowing through T2 when the isolation gate 17 is turned on. The gate voltage of T1, $V_{ref}$, chosen according to $V_{ref}-V_{pre}\cong V_t$, is typically close to $V_{dd}$. In the second embodiment without the provision of transmission gate 17, as will be described in greater detail herein, the drive signal 13 controlling T2 is pulsed.

According to the first embodiment, to begin the read cycle, the precharge transmission gate 18 is turned off, and the wordline of the selected cell is raised to a boosted level (above $V_{dd}$). Concurrently, in a selected bank of sense amplifiers to initiate a sensing sequence, the iso signal 27 which controls the isolation transmission gate 17 is lowered, making the isolation transmission gate 17 conducting. The voltage at node 2 rapidly approaches that at node 1, which has been precharged to $V_{pre}$. The resulting current that flows, originating from the power supply at the source of T2, through the reference transistor T1, depends on the memory cell state. If the cell contains a high state, the bitline voltage is scarcely affected and the current through T1 will be substantially equal to the current flowing through T2. Thus, the high potential on node 3 is maintained. If the cell contains a low state, a sense current will begin to flow through the access transistor of the selected cell, effecting a change in the current through T1. This current is larger than the current supplied by T2, so that the increased current through T1 will be efficient in discharging the small capacitance of node 3. Because T1 is biased in the sub-threshold regime, its current is an exponential function of the gate-to-source voltage and hence the bitline sees a low impedance looking into the source of T1. Thus, the bitline will have only a small downward swing in the case of a low cell state and very little upward swing in the case of a high cell. To summarize, the small voltage swing on the bitline is translated into a large voltage swing on node 3, reducing the inter-bitline coupling noise while producing a signal adequate for sensing.

Transistor T3, which is maintained in the off-state as long as node 3 has not been discharged through T1, is used to further amplify the signal on node 3. T3 may comprise a low threshold voltage p-channel FET. Alternatively, an elevated supply voltage $V_{gg} > V_{dd}$, or a forward body bias may be applied to lower the threshold voltage of T3, in order to achieve adequate gain necessary to pull up node 4. The node 4 has been precharged to ground by a preset transistor T6. In the case of a high cell state, node 3 will not appreciably discharge, and p-channel transistor T3 remains off. In the case of a low cell state, the voltage on node 3 will dip sufficiently to turn on T3, causing the voltage on node 4 to rise. Inversion of the signal on node 4 through CMOS inverter I1 gives the sense amplifier output at node 5; both the output at node 5 and its complement at node 4 are available for transfer to global data lines. Finally, the latch is set (set_latch goes low), turning on transistor T5 and the feedback transmission gate 19. The turning on of the feedback transmission gate 19 enables a write back of the cell state to node 2 and, through the isolation transmission gate 17, to the bitline 12 and storage node. The turning on of transistor T5 anchors node 4 to ground in the case of a high cell state (so T4 is on). External data can be written to the cell using the same feedback loop simply by imposing the data and its complement on node 5 and node 4, effectively overwriting the cell state just read.

Figures 2A, 2B, 2C, 2D:
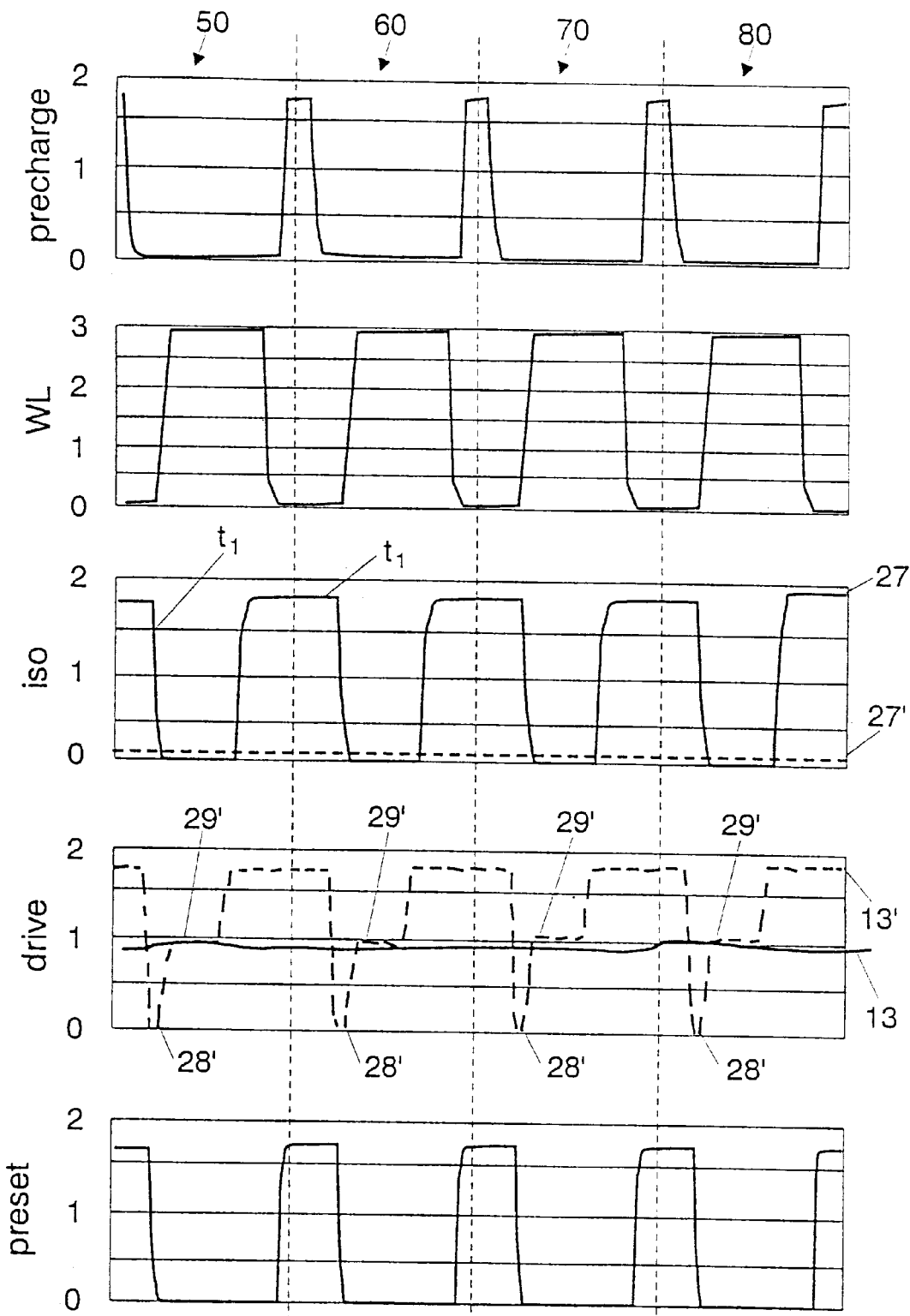
FIGS. 2(a)–2(d) illustrate various DRAM simulation results corresponding to the following read/write simulations.

FIGS. 2(*a*)–2(*d*) illustrate various DRAM simulation results corresponding to the following actions: 1) a "Write 0/1" operation 50 where, in a first cycle, a logic 0 is written to a first memory cell as indicated by bit-line (node 1) voltage waveform 52 in FIG. 2(*a*), and, a logic 1 is written to a second memory cell as indicated by bit-line (node 1) voltage waveform 54 in FIG. 2(*a*); 2) a "Read 0/1" operation 60 where, in a second cycle, the logic 0 is read from the first memory cell indicated as bit-line voltage waveform 62 in FIG. 2(*b*), and, a logic 1, indicated as voltage waveform 64, is read from the second memory cell as indicated in FIG. 2(*b*); 3) a "Write 1/0"operation 70 where a logic 1 is now written to the first memory cell as indicated by bit-line (node 1) voltage waveform 72 in FIG. 2(*c*), and, a logic 0 is now written to the second memory cell indicated as voltage waveform 74 as indicated in FIG. 2(*c*); and 4) a "Read 1/0" operation 80 where, in a fourth cycle, the logic 1 is read from the first memory cell as indicated by voltage waveform 82 in FIG. 2(*d*), and, a logic 0 is read from the second memory cell in a fourth cycle as indicated by voltage waveform 84 in FIG. 2(*d*). As shown in FIGS. 2(*a*)–2(*d*), in each of the read and write cycles, after the isolation transmission gate 17 is made conducting at time indicated as t1, and until the fall of the latch pulse 45, an amplifier sense charge is developed at node 3. During this time period, as exemplified by FIGS. 2(*a*)–2(*d*), the swing of the bitline voltage at the bit-line (node 1) is kept small until the latch is set, i.e., when the set$_{13}$ latch signal 45 falls at time t2. However, at such time the latch is set indicated at time t2, the voltage at amplifier sensing node 3 swings sharply lower if the cell is in a low state, but maintains its high level if the cell is in a high state. Thus, it is understood that the amplification of a small voltage swing on the high capacitance bit line corresponds to a large voltage swing on the low capacitance sense node. Finally, this large signal swing is translated to rail-to-rail swings on the output nodes, node 4 and node 5 at the output of the inverter I1, as indicated by the waveforms nodes 4 and 5 illustrated in FIGS. 2(*a*)–2(*d*). Further, the voltages on these nodes may be transferred to global bitlines. It is further understood that the voltage on node 5 may be used for writing the state back to the memory cell via the feedback loop 15 (FIG. 1) in the manner known to skilled artisans.

In accordance with the second embodiment of the sense amplifier, shown in FIGS. 1 and 2(*a*)–2(*d*), the iso signal 27' is always conducting; i.e., the transmission gate 17 is consequently not needed and may be omitted. Rather, in accordance with the second embodiment, the drive signal 13' at the gate of transistor T2 is pulsed. Prior to sensing, the drive signal 13' is high so transistor T2 is off and no current flows through reference transistor T1. To begin sensing, the drive signal 13' is brought to a low value (e.g., 0 V) which brings up the voltage at node 3 to $V_{dd}$ through the current-supplying transistor T2 (FIG. 1). The drive voltage 13' is then brought up to some intermediate voltage level, e.g., about 1.0 volts at 29', to enable the voltage at node 3 to fall rapidly in the case of a low state in the selected memory cell. The choice of the drive waveform 13' may be adjusted depending upon the p-type FET transistor T2 available in the given technology.

Elimination of the isolation gate has a further important advantage: the node 2 voltage (i.e., the source of reference transistor T1) remains at the precharge voltage $V_{pre}$ (approximately a threshold voltage below $V_{ref}$). Thus, the reference transistor T1 remains in the weakly "on" state which is beneficial for the stability of the gate voltage $V_{ref}$ at T1 which would be affected by the change of potential of node 2 when T1 goes from being "off" to being weakly "on".

If the precharge voltage $V_{pre}$ is chosen slightly below the desired final value of approximately $V_{ref}$–$V_t$, another advantage of the present embodiment can be achieved. Since the drive signal 13' is brought to a low value after the precharge is complete (i.e., after the precharge signal goes low), the voltage on the bitline before sensing begins will be changed slightly due to the current through transistor T1. The actual voltage adjustment will depend on the threshold voltage of T1 which may vary from circuit to circuit. Therefore, each amplifier in a memory array may be locally precharged to its desired value even though the same precharge voltage $V_{pre}$ is uniformly applied to all circuits.

Figure 3:
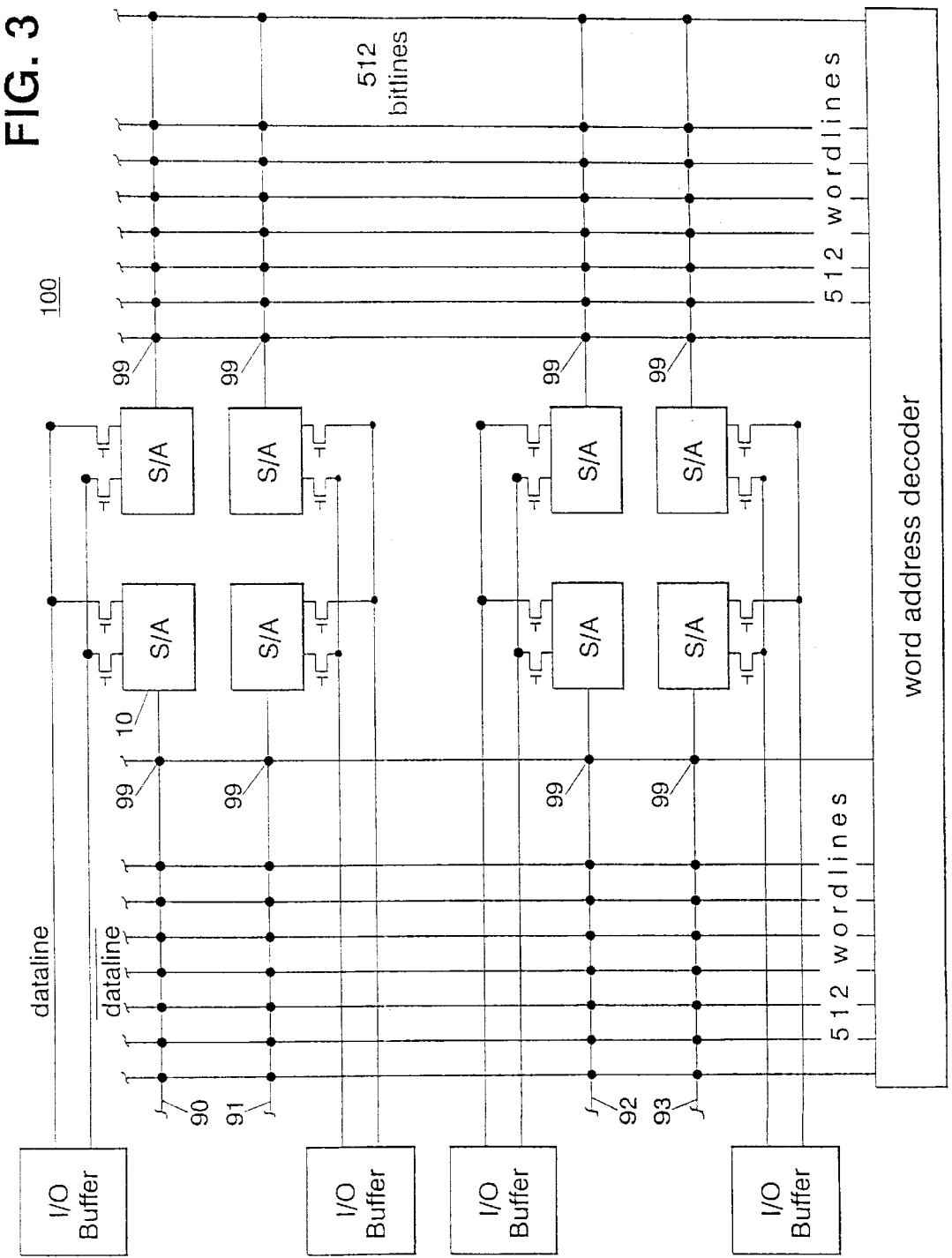
FIG. 3 illustrates an example memory system schematic 100 of a 0.5 Mbit DRAM macro configured with the low voltage single-input current-sensing amplifier of FIG. 1.

FIG. 3 is an example memory system schematic 100 of a 0.5 Mbit DRAM macro configured with the low voltage single-input current-sensing amplifier of FIG. 1. According to the invention, as the small bitline swing at bit-lines 90–93 allows a high inter-bitline capacitance, a single sense amplifier 10 may be made to serve more memory cells than a conventional voltage-sensing scheme where high bitline capacitance is a major limiting factor. Since the current-sensing amplifier 10 of the invention requires a single input, it is ideally suited for open bitline architectures in which a memory cell is laid out in an area smaller than $8F^2$ (F is the minimum feature size) and every crosspoint between a wordline and a bitline has a memory cell 99. By contrast, the additional input required in a conventional cross-coupled latch sense amplifier limits the number of occupied cells to only half of the crosspoints and hence limits the minimum cell area to $8F^2$.

Figure 4:
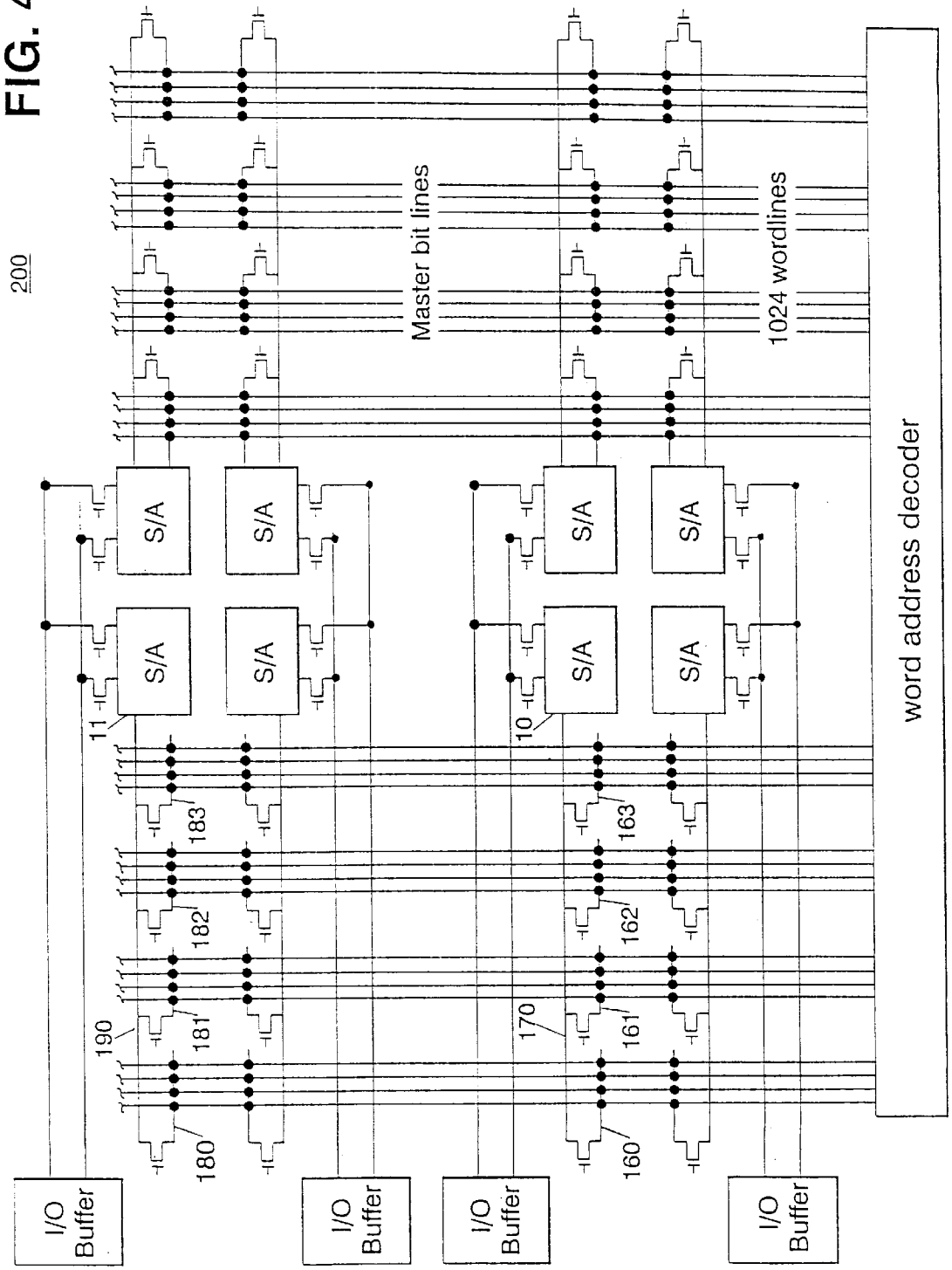
FIG. 4 illustrates a hierarchical bitline scheme for a memory array that may be realized in accordance with the principles of the invention.

The $8F^2$ cell size limit imposes a severe constraint on achieving acceptable array efficiencies and hence on the folded bitline architecture. One proposed solution to avoid the cell size limitation above is the vertically folded (twisted) bitline architecture, although its conventional sense amplifier still suffers from the low voltage drive and bitline capacitance scaling problems described above. In contrast to the twisted bitline scheme in which the two inputs of a conventional sense amplifier are constructed using two wiring levels, the single input of the current-sensing amplifier requires only one wiring level in the bitline. If a second wiring level is available, it can be used advantageously to realize a hierarchical bitline scheme 200, shown schematically in FIG. 4. In this scheme 200, the memory cells are connected to a local bitline which is, in turn, connected to a master bitline. For instance, as shown in FIG. 4, local bitlines 160–163 are connected to master bitline 170 which is input to sense amplifier 10, and local bitlines 180–183 are connected to master bitline 190 which is the single input to sense amplifier 11 as shown in FIG. 4. Since only the local bitline of the selected cell need be connected to the master bitline, the bitline capacitance seen by the sense amplifier is effectively reduced, and the number of cells which can be served by a single sense amplifier is magnified.

In accordance with the foregoing, the preferred features of the low voltage single-input current-sensing amplifier include: 1) the low input impedance characteristic at the source side of the reference transistor which limits the voltage swing on bitline, and reduces coupling noise to neighboring bitlines; 2) basing the sense amplifier design on a charge-transfer scheme between the cell node capacitance $C_N$, $C_{b1}$ (local bitline), and $C_{node3}$ (sensing node). With typical values of $C_N$=30 fF, $C_{b1}$=100 fF, and $C_{node3}$=10–20 fF, a typical bit-line swing on $C_{b1}$ is about 0.2 V resulting in about a 0.55 V signal swing on the sense amplifier node $C_{node3}$;3) in the first embodiment, no quiescent current flow through T1 due to provision of isolation transmission gate T7–T8, keeping standby power low; in the second embodiment (with no isolating transmission gate) the drive signal is used to turn off T2 so no quiescent current flows; 4) single input and low noise coupling facilitates crosspoint memory architectures so that arrays with sub-$8F^2$ cells can be realized with one level of bitline wiring, compared to two levels required in the twisted bitline architecture; and, 5) provision of a second bitline wiring level may be used to realize a hierarchical bitline architecture capable of serving many more cells with one sense amplifier.

The design of the invention is thus fundamentally different from the prior art in eliminating the idling current through the reference transistor and in limiting the bitline voltage swing.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A current sensing system for a memory circuit comprising an array of memory cells, each memory cell for storing a charge that is accessible by bit-line and a word-line, with a bitline having one or more cells connected thereto, said current sensing system comprising:
   a sense amplifier device for sensing a bit-line voltage, said sense amplifier device including a reference transistor having first, second and gate terminals, a first terminal connected to the bit line, and a second terminal defining an amplifier sense node, and a gate terminal for receiving a reference voltage;
   a mechanism for preventing quiescent current flow through said reference transistor prior to a sensing operation, and enabling current flow through said reference transistor from a first voltage source during a sensing operation;
   a mechanism for applying a precharge voltage to said bit-line such that said reference transistor may be biased to a sub-threshold regime during a sense operation,
   wherein, upon accessing a memory cell during said sense operation, said reference transistor is biased to said sub-threshold regime for enabling a large voltage swing at said amplifier sense node depending upon the state of said memory cell, while exhibiting low bit-line voltage swing.

2. The current sensing system as claimed in claim 1, wherein said mechanism for preventing quiescent current flow comprises a first gate device for operatively isolating said bit line from said reference transistor prior to a sensing operation, and coupling said bit line to said reference transistor during a sensing operation, said first gate device receiving a pulse input for coupling the bit-line to said first terminal of said reference transistor during said sense operation.

3. The current sensing system as claimed in claim 2, wherein said first gate device enables multiplexed input of a plurality of bitlines to said sense amplifier.

4. The current sensing system as claimed in claim 2, wherein said gate device is a transmission gate.

5. The current sensing system as claimed in claim 2, wherein said mechanism for applying a precharge voltage to said bit-line includes a second gate device operative for applying a voltage from a second voltage source to said bit-line prior to said sense operation, and for isolating said second voltage source from said bit-line during said sense operation.

6. The current sensing system as claimed in claim 2, further including a further transistor device operative for enabling a current flow between said first voltage source to said amplifier sense node during said sense operation, said further transistor device comprising a gate terminal having a fixed drive voltage source.

7. The current sensing system as claimed in claim 1, wherein a voltage difference between said precharge voltage and said reference voltage enables biasing of said reference transistor to said sub-threshold regime, said first terminal providing a low-impedance load at said bit-line during said sensing operation.

8. The current sensing system as claimed in claim 1, further comprising a latch-device for latching a voltage provided at said amplifier sense node after said sensing.

9. The current sensing system as claimed in claim 1, wherein said mechanism for preventing quiescent current flow comprises a further transistor device operative for preventing current flow from said first voltage source to said amplifier sense node prior to a current sensing operation, and operatively coupling said first voltage source to said amplifier sense node during said sense operation.

10. The current sensing system as claimed in claim 9, wherein said further transistor device includes a gate terminal having an applied gate voltage level for preventing said current flow prior to said sense operation and driven to enable said current flow for initiating said sense operation.

11. The current sensing system as claimed in claim 10, wherein said gate terminal is driven with a gate drive voltage at a level for enabling said first voltage source to provide a voltage precharge at said amplifier sense node at a beginning of said sense operation.

12. The current sensing system as claimed in claim 11, wherein after said beginning of said sense operation, said gate terminal being driven with a gate drive voltage at a level for enabling said voltage precharge to rapidly decay at said sense node in the case of a low memory cell charge state, or be retained in the case of a high memory cell charge state, said voltage level being intermediate to the gate drive voltage level for preventing current flow and the gate drive voltage level for applying said precharge voltage to said amplifier sense node.

13. The current sensing system as claimed in claim 1, further including a plurality of bit-lines applied to a plurality of sense amplifiers, said memory array exhibiting reduced bitline-bitline coupling noise during said sense operation.

14. The current sensing system as claimed in claim 1, wherein a plurality of local bit-lines connect through a master bit-line for input to said sense amplifier.

15. In a memory circuit comprising an array of memory cells for storing a charge, wherein each memory cell charge is accessible by a bit-line and word-line, a method for rapidly sensing memory cell state by a sense amplifier, said method comprising:
   a) providing a sense amplifier including a reference transistor having a first terminal for receiving a bit line input, a second terminal defining an amplifier sense node and, a gate terminal receiving a reference voltage;
   b) preventing quiescent current flow through said reference transistor prior to a sensing operation, and enabling current flow through said reference transistor from a first voltage source during a sensing operation;
   c) precharging said bit-line to a fixed voltage such that said reference transistor may be biased to a sub-threshold regime during said sense operation;
   d) selecting a wordline of a memory cell whose charge state is to be sensed during a sense operation; and,
   e) accessing a memory cell during said sense operation, said reference transistor being biased to said sub-threshold regime for enabling a large voltage swing at said amplifier sense node depending upon a state of said memory cell, while exhibiting low bit-line voltage swing.

16. The method as claimed in claim 15, wherein said step b) of preventing quiescent current flow includes the step of isolating said bit line from said reference transistor by a gate device prior to said sensing operation.

17. The method as claimed in claim 15, wherein said reference transistor provides low impedance load at said bit-line to enable said bit-line to exhibit low voltage swing.

18. The method as claimed in claim 15, wherein said step c) of precharging said bit-line to a fixed voltage includes enabling a gate device to conduct a voltage from a second voltage source to said bit-line.

19. The method as claimed in claim 15, wherein said step b) of preventing quiescent current flow includes the step of driving a gate of a further transistor device at a voltage level for preventing current flow from said first voltage source to said amplifier sense node prior to a current sensing operation.

20. The method as claimed in claim 19, further including the step of driving said gate of said further transistor device at a voltage level for operatively coupling said first voltage source to said amplifier sense node to provide a precharge voltage to said amplifier sense node at a beginning of said sense operation.

21. The method as claimed in claim 20, wherein after said beginning of said sense operation, the step of driving said gate at a voltage level for enabling said voltage precharge to rapidly decay at said sense node in the case of a low memory cell charge state, or be retained in the case of a high memory cell charge state, said voltage level being intermediate to the gate drive voltage level for preventing current flow and the gate drive voltage level for applying said precharge voltage to said amplifier sense node.

* * * * *